United States Patent [19]

Kramer

[11] Patent Number: 5,427,531
[45] Date of Patent: Jun. 27, 1995

[54] DYNAMIC SIMULATION OF MECHANISMS
[75] Inventor: Glenn A. Kramer, Austin, Tex.
[73] Assignee: Schlumberger Technology Corporation, Austin, Tex.
[21] Appl. No.: 963,861
[22] Filed: Oct. 20, 1992
[51] Int. Cl.⁶ .............................................. G09B 19/00
[52] U.S. Cl. ..................................... 434/302; 364/578
[58] Field of Search ............... 364/578, 512, 566, 513; 434/302

[56] References Cited

U.S. PATENT DOCUMENTS

| | | | |
|---|---|---|---|
| 4,736,306 | 4/1988 | Christensen et al. | 364/513 |
| 4,831,548 | 5/1989 | Matoba et al. | 364/513 |
| 4,835,709 | 5/1989 | Tsai | 364/513 |
| 5,043,929 | 8/1991 | Kramer et al. | 364/578 |

OTHER PUBLICATIONS

R. S. Ball. *A Treatise on the Theory of Screws.* Cambridge University Press, Cambridge, UK 1900.
D. R. Brown and L. J. Leifer. The role of meta-level inference in problem-solving strategy for a knowledge-based dynamics analysis aid. *Journal of Mechanical Design, Trans. ASME,* 113:438-445, Dec. 1991.
Stephen H. Crandall, Dean C. Karnopp, Edward F. Kurtz, Jr., and David C. Pridmore-Brown. *Dynamics of Mechanical and Electromechanical Systems.* Robert E. Krieger Publishing, Inc., Malabar, Fla., 1982. Originally published: McGraw-Hill, New York, 1968.
James F. Cremer. *An Architecture for General Purpose Physical System Simulation-Integrating Geometry, Dynamics, and Control.* PhD thesis, Cornell University, Ithaca, N.Y., Apr. 1989. Department of Computer Science TR 89-987.
A. Gelsey and D. McDermott. *Spatial Reasoning about Mechanisms,* Research Report, Yale University, Aug. 1988. YALEU/DCS/RR No. 641.
A. S. Hall, Jr. *Kinematics and Linkage Design.* Balt Publishers, West Laffayette, Ind., 1961. Republished by Wavelength Press, Prospect Heights, Ill. (1986).
R. S. Hartenberg and J. Denavit. *Kinematic Synthesis of Linkages.* McGraw-Hill, New York, 1964.
Edward Haug. *Computer Aided Kinematics and Dynamics of Mechanical Systems,* vol. 1 Basic Method. Department of Mechanical Engineering, University of Iowa, Iowa City, Iowa, 1985.
L. Joskowicz and E. P. Sacks. Computational kinematics. *Artificial Intelligence,* 51:381-416, 1991.
Hyun-Kyung Kim. Qualitative kinematics of linkages. Technical Report UIUCDS-R-90-1603, University of Illinois, Champaign-Urbana, May 1990.
Glenn A. Kramer. *Solving Geometric Constraint Systems: A case study in kinematics.* MIT Press, Cambridge, Mass., 1992.
Glenn A. Kramer. A geometric constraint engine. *Artificial Intelligence, (to appear).*
N. Orlandea, M. A. Chase, and D. A. Calahan. A sparsity oriented approach to the dynamic analysis and design of mechanical systems—parts I and II. *Journal of Engineering for Industry, Trans. ASME Ser. B,* 99:773-779, 780-784, 1977.
Elisha Sacks and Leo Joskowicz. Mechanism simulation with configuration spaces and simple dynamics. Department of Computer Science Technical Report CS-TR-367-92, Princton University, Princeton, N.J., Mar. 1992.
D. S. Weld and J. de Kleer, editors. *Readings in Qualitative Reasoning about Physical Systems.* Morgan Kaufmann, San Mateo, Calif., 1990.

Primary Examiner—Richard J. Apley
Assistant Examiner—Glenn E. Richman
Attorney, Agent, or Firm—Charles D. Huston

[57] ABSTRACT

A method of dynamic simulation of mechanisms which constructs the lagrangian form of the dynamics equations as pure differential equations in terms of a minimal set of generalized coordinates. The dynamics problem is separated into two parts used in the lagrangian—a kinematic analysis and a kinetics analysis. The kinematic analysis is computed using a degrees of freedom analysis. The velocities required for the kinetic analysis are computed using screw theory. Once constructed, the lagrangian dynamics equations are solved for accelerations, applied to the mechanism, and integrated over time to simulate the dynamics of the mechanism. The kinetic and kinematic analyses are approximately linearly related to the number of components in the mechanism, allowing efficient solution of dynamics problems at interactive rates.

13 Claims, 5 Drawing Sheets

DYNAMIC SIMULATION OF MECHANISMS

TECHNICAL FIELD

The present invention relates to a system and method for simulating the dynamics of a mechanism, and in particular, for constructing the lagrangian form of the dynamics equation with pure differential equations permitting interactive simulation

BACKGROUND

Understanding complex mechanical devices requires the ability to simulate the behaviors of the devices, and to make reasonable generalizations about those behaviors. Mechanism simulation may be done at a purely qualitative level, a mixed numerical/qualitative level, or at a detailed numerical level followed by qualitative characterization of the results. See, Hyun-Kyung Kim. Qualitative kinematics of linkages. Technical Report UIUCDS-R-90-1603, University of Illinois, Champaign-Urbana, May 1990; L. Joskowicz and E. P. Sacks. Computational kinematics. *Artificial Intelligence*, 51:381–416, 1991; Andrew Gelsey. *Automated Reasoning about Machines.* Ph.D. thesis, Yale University, April 1990. YALEU/CSD/RR No. 785. Each of these approaches has advantages and disadvantages with regard to predictive power, generation of incomplete or impossible behaviors, and computational cost. Detailed numerical simulation provides the most accurate level of detail, but at the highest cost. Since multiple simulations are needed to extract data about trends (e.g. velocity vs. change in a parameter value), precise numerical simulation is often unattractive, particularly at the earliest stages of design.

Simple processes and mechanical systems have been described in a number of qualitative reasoning systems. See, D. S. Weld and J. de Kleer, editors. *Readings in Qualitative Reasoning about Physical Systems.* Morgan Kaufmann, San Mateo, California, 1990. Most systems handle only the simplest cases of nonlinearity, due to the coarse structure of the qualitative representations. More specialized qualitative reasoning, like trigonometric reasoning, can give more precise results, such as whether or not a particular link in a mechanism can rotate completely with respect to another. It cannot be used to describe specific attributes of the space curves traced by arbitrary points on the mechanism, yet this information is essential to designers.

As the description of the model is more finely discretized, more detail can be obtained from the simulation. Configuration spaces have been used to model a variety of mechanisms. The representation becomes computationally intractable for more complicated non-fixed-axis mechanisms. However, within its domain of applicability, the configuration space approach is able to deal with topology changes during the operation of the mechanism. Simple approximations to dynamic behavior, incorporating models of steady-state forces, allow a number of mechanisms to be simulated at a coarse dynamic level. See, Elisha Sacks and Leo Joskowicz. Mechanism simulation with configuration spaces and simple dynamics. Department of Computer Science Technical Report CS-TR-367-92, Princton University, Princeton, N.J., March 1992.

Detailed numerical simulation, followed by abstracting the results into qualitatively interesting regions, is the most accurate and general approach to describing dynamics in qualitative terms. However, the process can be time-consuming due to long runtimes for general-purpose simulators. Since many simulation runs may be needed to extract data about behavioral trends, this approach can be computationally infeasible.

In the matrix-based approach to dynamics, the kinematic equations and the differential equations are solved together. One approach is to use a maximally redundant set of generalized coordinates (six positional and six velocity per rigid body), and solve using sparse matrix techniques. N. Ofiandea, M. A. Chase, and D. A. Calahan. A sparsity oriented approach to the dynamic analysis and design of mechanical systems—parts I and II. *Journal of Engineering for Industry, Trans. ASME Ser. B,* 99:773–779, 780–784, 1977. The resulting equations are stiff, and therefore require small integration time-steps. Other approaches attempt to reduce the number of generalized coordinates in order to improve computational efficiency, and to help reduce the stiffness of the matrix. See, Edward Haug. *Computer Aided Kinematics and Dynamics of Mechanical Systems,* volume 1 Basic Method. Department of Mechanical Engineering, University of Iowa, Iowa City, Iowa, 1985.

General-purpose simulators usually deal with fixed topology mechanisms. A simulator with built-in capabilities for detecting collisions and other topological changes has been proposed. This simulator reformulates the equations when changes occur, and then continues dynamic simulation. See, James F. Cremer. *An Architecture for General Purpose Physical System Simulation-Integrating Geometry, Dynamics, and Control.* Ph.D. thesis, Cornell University, Ithaca, N.Y., April 1989. Department of Computer Science TR 89-987.

An alternative to detailed numerical solution of the mixed algebraic/differential equations is the Dyne symbolic system which generates a set of pure differential equations, which describe the system in terms of a minimal set of generalized coordinates corresponding to the system's true degrees of freedom. The Dyne system uses symbolic reasoning to derive such equations, guided by a set of algebraic transformation rules and meta-level control rules. Such systems are hard to design, maintain, and debug. However, the equations derived using Dyne are useful to designers performing sensitivity analysis at selected points in the mechanism's behavior, and for describing qualitative regions of behavior. D. R. Brown and L. J. Leifer. The role of meta-level inference in problem-solving strategy for a knowledge-based dynamics analysis aid. *Journal of Mechanical Design, Trans. ASME,* 113:438–445, December 1991.

Symbolic geometric solution of kinematics problems using degrees of freedom analysis has been made. See, Glenn A. Kramer. *Solving Geometric Constraint Systems: A case study in kinematics.* MIT Press, Cambridge, Mass., 1992. The present invention is an entirely different approach to the solution of such geometric constraint problems and avoids algebraic reformulation of the geometric entities and constraints. Instead, the present method reasons directly about the degrees of freedom of the geometric entities that are possible.

Geometric entities have degrees of freedom which allow them to vary in location or size. For example, in 3 dimensional space a general fairly rigid body has three translational and three rotational degrees of freedom. A circle with a variable radius has three translational, two rotational, and one dimensional degree of freedom. In the present application the term "configuration" of a geometric entity is considered to be translational, rotational, and dimensional degrees of freedom variables used to parameterize the geometric entity. A detailed discussion of "degrees of freedom" analysis is discussed in U.S. Pat. No. 5, 043,929 commonly assigned to applicant (incorporated by reference for all purposes).

Direct methods for dynamics can be traced to Euler, who advocated treating dynamics by partitioning the problem into two parts: kinematics and kinetics. See, R. S. Hartenberg and J. Denavit. *Kinematic Synthesis of Linkages.* McGraw-Hill, New York, 1964. Kinematics deals with the positions of the parts of the mechanism as constrained by geometric relationships. Relative (but not absolute) velocities and accelerations often can be calculated kinematically. Kinetics deals with how physical objects move under the effect of forces, and deals with absolute velocity, acceleration, mass, inertia.

Euler also demonstrated how an object in three-dimensional space can be moved from one position to an arbitrary second position by a combination of a single translation and a single rotation, where the rotation axis is parallel to the translation vector, resulting in a screw-like motion. At any instant in time, a body in motion may be thought of as moving about an instantaneous screw in space; this screw's position, orientation, and pitch changes over time. The theory of screws was treated in depth in a geometric manner in R. S. Ball. *A Treatise on the Theory of Screws.* Cambridge University Press, Cambridge, UK, 1900.

The nonpatent references cited herein are incorporated by reference for background.

It would, therefore, be a significant advance in the art if an efficient method were devised for simulating the dynamics of complex mechanisms, permitting efficient solution of dynamics problems at interactive rates.

SUMMARY

The present invention provides an intelligent computational methodology for performing accurate dynamic analysis of rigid-body mechanisms in an efficient, interactive manner. This methodology allows fast evaluation of design alternatives, and provides information for sensitivity analysis and force analysis. The approach of the present invention separates the problem into kinematics and kinetics, as first proposed by Euler. The kinematic analysis is efficiently computed using: degrees of freedom analysis. Velocity analysis, required for kinetics, is performed using screw theory, formulated as another geometric constraint problem. This analysis allows easy derivation of the Lagrangian form of the dynamics equations in terms of a minimal set of generalized coordinates, thereby resulting in efficient and stable computation methods. In addition, by adjusting the time-step, coarse grained dynamic analysis is possible in an even more efficient manner.

Broadly speaking, the method of dynamic simulation of the present invention automatically formulates a representation (preferably lagrangian) of the dynamics of the mechanism. Kinematic information of the mechanism is determined and used as a potential energy term in the lagrangian representation. The kinetic coenergy term of the lagrangian representation is determined by finding the instantaneous screw axes of at least some of the mechanism components and calculating the angular and linear velocities of at least some of the mechanism components. The angular and linear velocities are ratios of distances of components center of mass to respective screw axes. The dynamic behavior of the mechanism is simulated over time, given starting values of mechanism position and velocities, by solving the lagrangian representation for accelerations and integrating over time.

In a preferred form, the kinematic information is determined as a function of the generalized position of the mechanism components using a degrees of freedom analysis. Preferably, the kinematic information is determined by calculating for one component the change in position of the mass center as a function of the change of the generalized position coordinates for the mechanism. With a known change of position of a component, the change in position of the other components' center of mass can be determined as a function of the ratio of the linear velocities of the components' center of masses.

Preferably the lagrangian representation is a differential equation of the form $$\frac{d}{dt}\left[\frac{\partial L}{\partial \theta}\right] - \frac{\partial L}{\partial \theta} = \Xi$$

where $\Xi$ is the sum of any nonconservative forces; in the case of a conservative force, such as gravity, $\Xi$ is equal to 0. In this lagrangian representation, the first term is the kinetic coenergy term and the second term is the potential (i.e. kinematic) energy term.

DESCRIPTION OF A PREFERRED EMBODIMENT

1 Overview

The present invention formulates dynamic simulation into kinematic (or geometric) and kinetic (or force related) constraints, which allows efficient solution of dynamics problems at interactive rates. The method uses a geometric constraint engine, based on degrees of freedom analysis, for the kinematic solution with extensions to incorporate reasoning about dynamics. Additionally, the method calculates velocity ratios, formulated as a problem in geometry analogizing body displacements to screw axes. These calculations, in conjunction with the kinematic solution, allow determination of all kinetic and potential energy terms required for dynamic simulation. The constructed system of dynamics equations are pure differential equations in terms of a minimal set of generalized coordinates. The formulation results in small, dense matrices, rather than large, sparse ones. In principle, large time-steps may be used for coarse dynamic behavior, with smaller time-steps yielding better approximations to the true behavior, at the cost of more computation time.

The rigid bodies (or components) of the mechanism are thought of as moving about an instantaneous screws in space. With the instantaneous screws known for each body in a rigid-body mechanism, all relative velocities in the system are related by ratios of distances from the appropriate screws. Specifying one absolute velocity then allows finding all absolute velocities. The velocities provide the kinetic coenergy terms in the lagrangian formulation of dynamics, and the kinematic information provides the potential energy terms.

Figure 1:
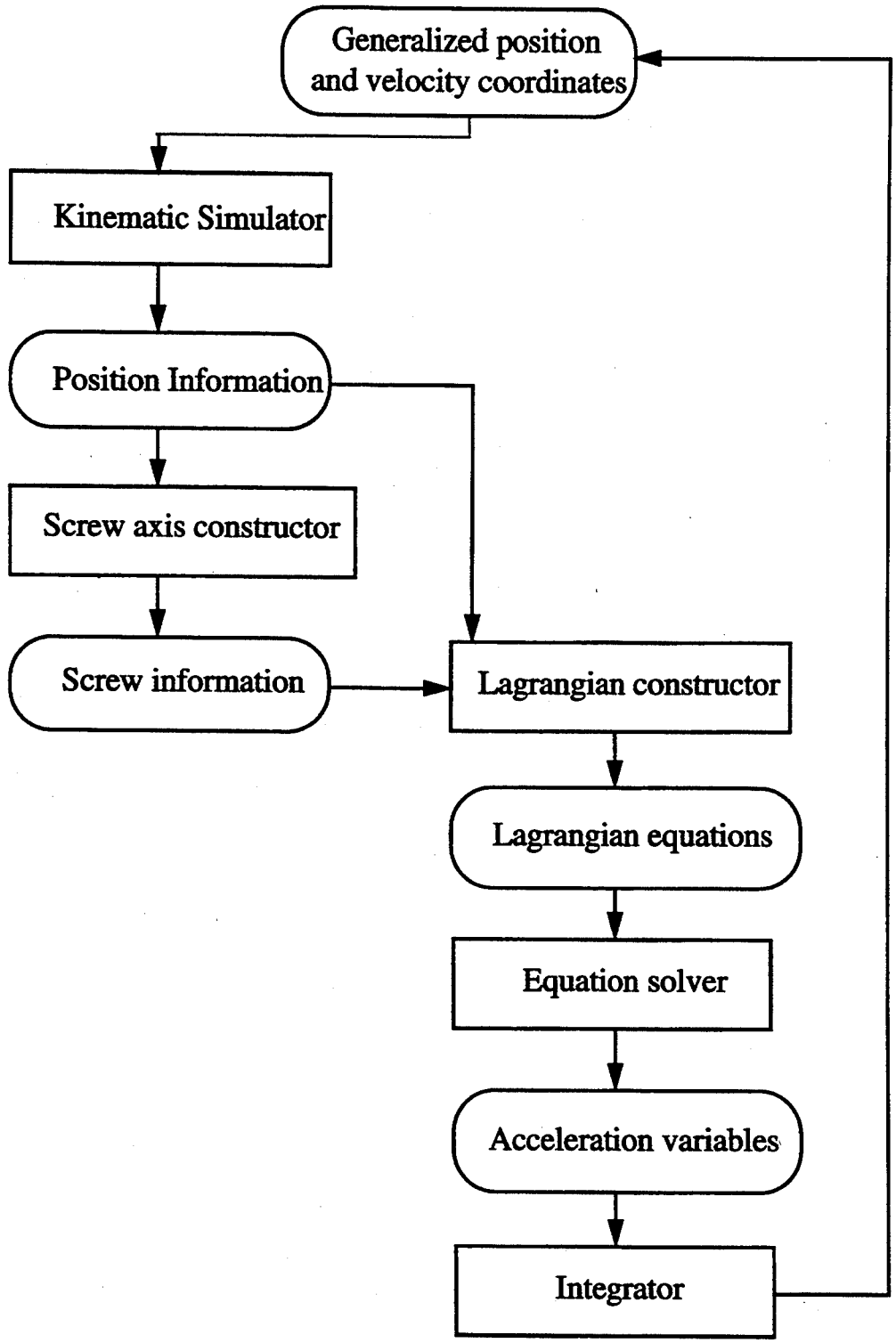
FIG. 1 is a flow chart describing the method of the present invention.

All terms required in the lagrangian are attainable from simple geometric constructions. This leads to the following method for constructing the lagrangian and using it in dynamic analysis as illustrated in FIG. 1.

1. Calculate the kinematic information in terms of the generalized position coordinates.
2. Find the instantaneous screw axes by geometric construction.
3. Calculate angular and linear velocities as ratios of distances between points on the mechanism and the screw axes.
4. Calculate the time derivatives of the screw axes.
5. Use the position and screw information to construct the lagrangian directly.
6. Solve the lagrangian for accelerations.
7. Integrate over time.

Steps 1-6 generate a plan which is iteratively reused to produce new values for accelerations which are integrated over time (step 7), resulting in dynamic simulation.

2 Example

Figure 2:
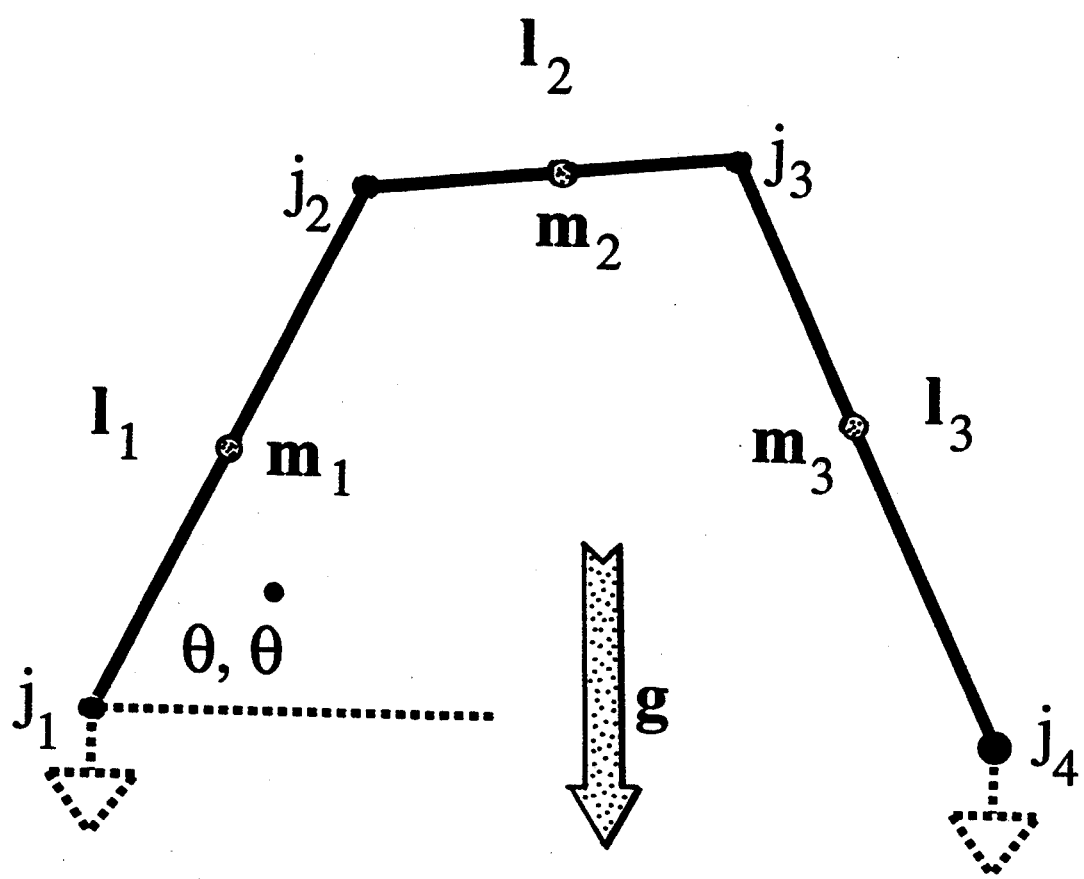
FIG. 2 is a schematic depiction of a four-bar linkage mechanism.

FIG. 2 describes a four-bar planar linkage as an example of a simple rigid-body mechanism. One of the links is Founded, or fixed to the global reference frame, and is not shown. The moving links (i.e., components or bodies) have lengths $l_1$, $l_2$, and $l_3$, and are modeled with masses $m_1$, $m_2$, and $m_3$ and rotational inertias $I_1$, $I_2$, and $I_3$. The revolute joints $j_i$ and $j_4$ connect the cranks (links $l_2$, $l_3$) to the ground; the remaining two joints $j_2$, $j_3$ connect the cranks (links $l_1$, $l_3$) to the coupler (link $l_2$). The linkage has one degree of freedom; the position of all links are determined fully by the crank angle $\Theta$, and the velocities by the first derivative $\dot{\Theta}$ of with respect to time $\dot{\Theta}$.

The example problem is an initial values problem. Given initial values for $\Theta$ and $\dot{\Theta}$, find the behavior of the linkage over time. In this problem, gravity (a conservative force) exerts a downward force, as illustrated, and the joints are assumed to be frictionless. Other acceleration forces may, of course, be applied to the mechanism.

The first portions of the method require: 1) calculating the: kinematic information as a function of the generalized position coordinates; 2) finding the instantaneous screw axes by geometric construction; and 3) calculating angular and linear velocities as ratios of distances of mass centers from the screw axes. The first item is covered by kinematic analysis U.S. Pat. No. 5,043,929 (incorporated by reference).

Figure 3:
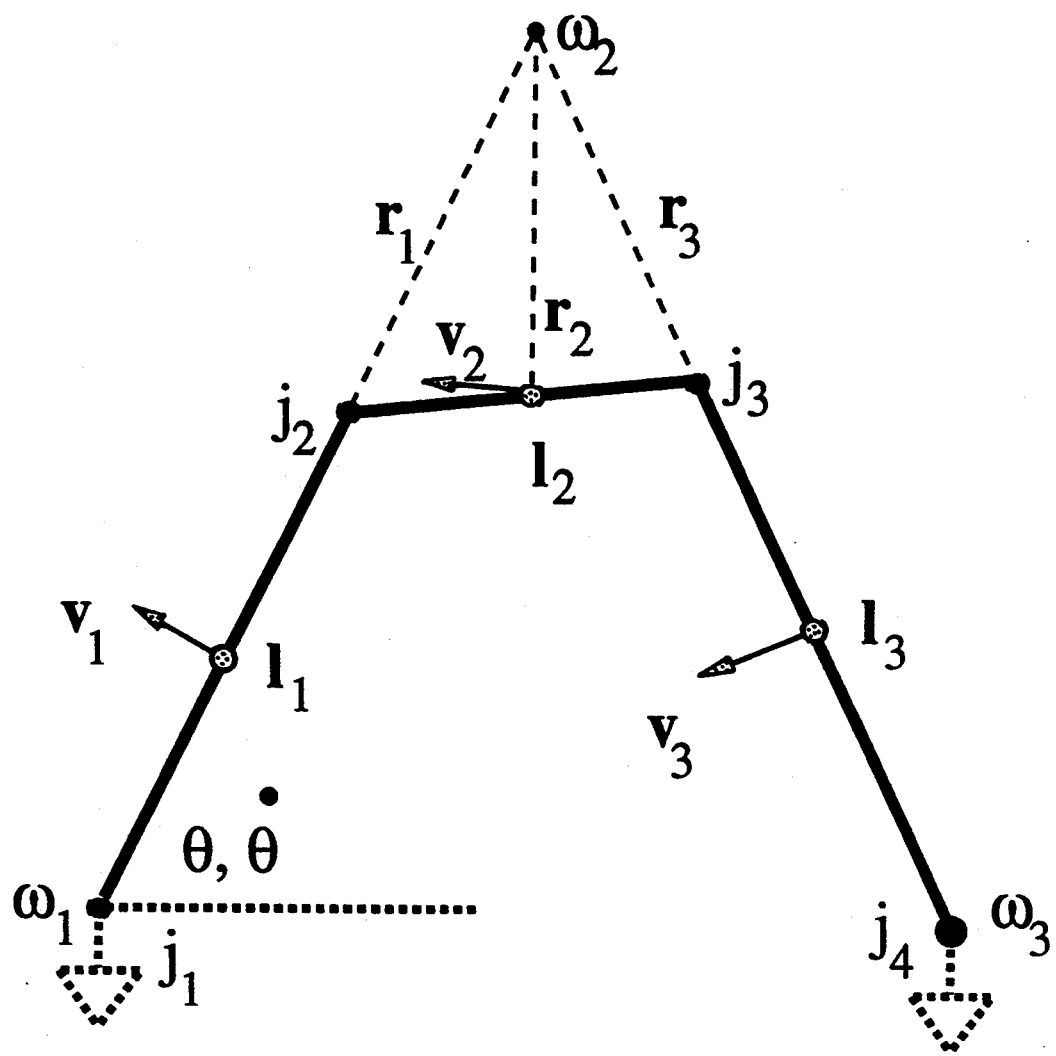
FIG. 3 is the four-bar linkage mechanism of FIG. 2, illustrating a solution technique for deriving the instantaneous center of rotation for link $L_2$.

In planar mechanisms, the axes of all instantaneous screws are normal to the plane, and the pitch is always zero. In this specialized case, the instantaneous screw is known as the instantaneous center of motion. FIG. 3 illustrates how the instantaneous centers and velocities are calculated. The instantaneous centers of the cranks (links $l_1$, $l_3$) are the fixed joints ($j_i$ for link $l_4$ and $j_4$ for link $l_3$); these centers do not change over time.

The instantaneous center for link $l_2$ is computed geometrically. Since joint $j_2$ is on the link $l_2$, it must rotate about the instantaneous center for link $l_2$. However, since $j_2$ is also on link $l_1$, it must rotate about $j_1$, and hence, its linear velocity must be perpendicular to the line describing link $l_1$. Therefore, the instantaneous center must lie on a line through $j_1$ and $j_2$. Using a similar argument for the motion of joint $j_3$, the instantaneous center for link $l_2$ is found by intersecting the two lines describing $l_1$, $l_3$. Link $l_2$ rotates about the intersection point with angular velocity $\omega_2$, which is yet to be determined. Similar constructions exist for general screws. See, R. S. Ball. *A Treatise on the Theory of Screws*. Cambridge University Press, Cambridge, UK, 1900.

The angular velocity of link $l_1$, $\omega_1$, is specified to be $\dot{\Theta}$, the first derivative of the crank angle $\Theta$ with respect to time. The angular velocity $\omega_2$ of link $l_2$ is found by equating the linear velocities at joint $j_2$: $\omega_1 l_1 = \omega_2 r_1$. In similar fashion, the remaining angular velocities are calculated:

$$\omega_1 = \dot{\Theta}$$

$$\omega_2 = -\omega_1(l_1/r_1) = -\dot{\Theta}_1(l_1/r_1)$$

$$\omega_3 = -\omega_2(r_3/l_3) = \dot{\Theta}_1(l_1 r_3/l_3 r_1)$$

The directions of the linear velocities are derived from the angular velocities $\omega_1$, $\omega_2$, $\omega_3$. The magnitudes of the linear velocities (assuming each center of mass is at the center of the link) follow directly from the angular velocities:

$$|v_1| = \omega_1(l_1/2) = \dot{\Theta}_1(l_1/2)$$

$$|v_2| = \omega_2 r_2 = \dot{\Theta}_1(l_1 r_2/r_1)$$

$$|v_3| = \omega_3(l_3/2) = \dot{\Theta}_1(l_1 r_3/2 r_1)$$

Thus, all angular and linear velocities are calculated as simple ratios of distances between instantaneous centers and points on the mechanism. For a more compact notation, the ratios are written as $\omega_i = \dot{\Theta} k_i$, and $|v_i| = \dot{\Theta} j_i$.

The lagrangian of the system is generated as follows (assuming a positive y axis moving upward in FIG. 3, and with $v_i = |v_i|$.

$$L = \frac{1}{2} \sum_i (m_i v_i^2 + I_i \omega_i^2) - g \sum_i m_i y_i$$

Here, $I_i$ is the moment of inertia for mass link i, and g is the acceleration of gravity. An alternative representation is the lagrangian differential equation describing the motion of the linkage as:

$$\frac{d}{dt}\left[\frac{\partial L}{\partial \dot{\Theta}}\right] - \frac{\partial L}{\partial \Theta} = 0$$

The second term in this lagrangian differential equation is the potential energy term, and is calculated as follows:

$$\frac{\partial L}{\partial \Theta} = -g \frac{\partial}{\partial \Theta} \sum_i m_i y_i = -g \sum_i m_i \frac{\partial y_i}{\partial \Theta}$$

The change in height (y) for each point mass is:

$$\frac{\partial y_i}{\partial \Theta} = \frac{\partial p_i}{\partial \Theta} \cdot \hat{y}$$

where $\delta p_1/\delta\Theta$ is the change in position of point mass $m_i$ with respect to a $\Theta$. This vector is always in the direction of $v_i$. The value of $\delta p_1/\delta\Theta$ is calculated from $\Theta$ as follows:

$$\frac{\partial p_1}{\partial \theta} = -\hat{x}\left(\frac{l_1}{2}\right)\sin\theta + \hat{y}\left(\frac{l_1}{2}\right)\cos\theta$$

The remaining position change magnitudes are related to each other directly as the magnitude of the linear velocities, which have already been computed geometrically:

$$\frac{|\partial p_i|}{|\partial p_j|} = \frac{|v_i|}{|v_j|}$$

The first term in the lagrangian differential equation is the kinetic coenergy term, and is calculated as follows. The derivative with respect to $\Theta$ is:

$$\frac{\partial L}{\partial \theta} = \sum_i \left(m_i v_i \frac{\partial v_i}{\partial \theta} + I_i \omega_i \frac{\partial \omega_i}{\partial \theta}\right) = \dot{\theta} \sum_i (m_i j_i^2 + I_i k_i^2)$$

The time derivative of this quantity is:

$$\frac{d}{dt}\left[\frac{\partial L}{\partial \theta}\right] = \ddot{\theta} \sum_i (m_i j_i^2 + I_i k_i^2) + 2\dot{\theta} \sum_i \left(m_i j_i \frac{dj_i}{dt} + I_i k_i \frac{dk_i}{dt}\right)$$

The first term of this time derivative involves the lengths of geometric entities already constructed. Evaluating the second term involves understanding how the instantaneous centers move over time. In this example, the only instantaneous center that moves over time is the center for link $l_2$.

Using the chain rule, finding the time derivatives of the $j_i$'s (as well as the $k_i$'s) is reduced to finding the derivatives of these quantities with respect to $\Theta$:

$$\frac{dj_i}{dt} = \frac{dj_i}{d\theta}\frac{d\theta}{dt} = \dot{\theta}\frac{dj_i}{d\theta}$$

In the general case, the differential $dj_i$ is the sum of the partials. Since this is a one variable problem, (i.e. $\Theta$) the total and partial differentials are equivalent.

Figure 4:
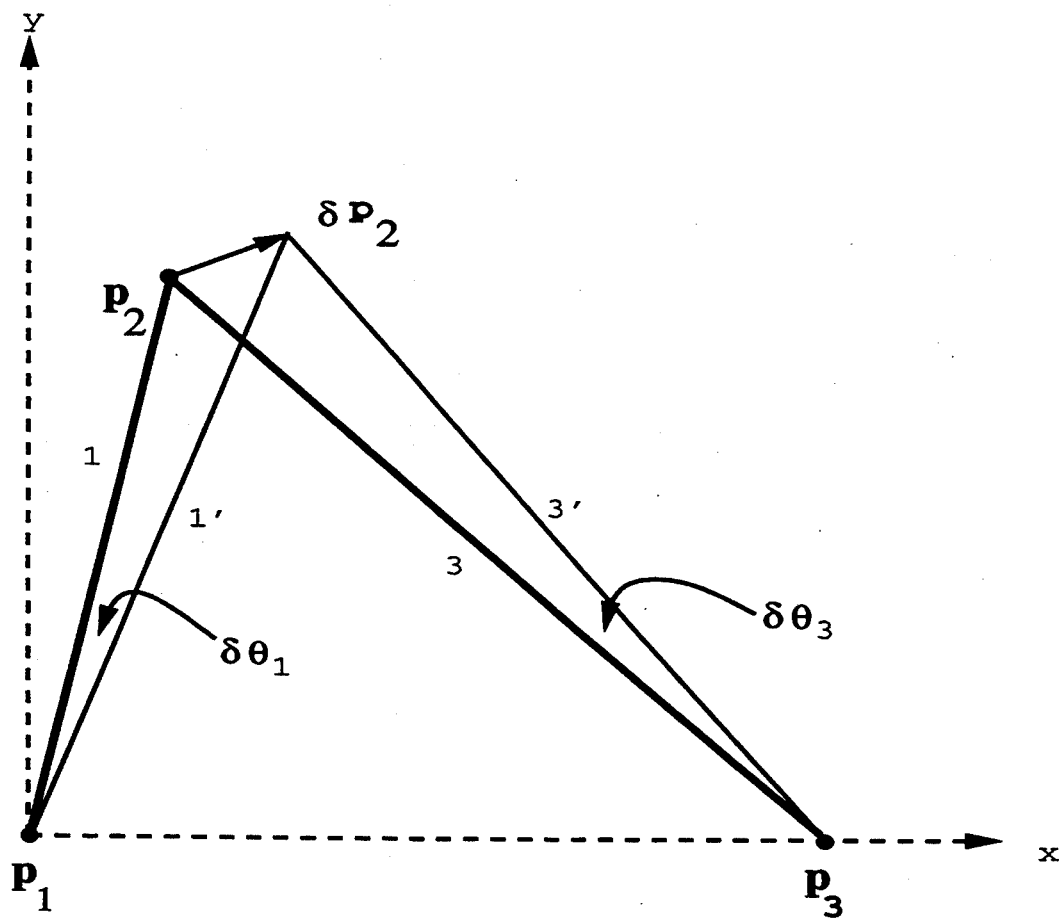
FIG. 4 is a schematic describing the method for calculating the derivative of an instantaneous center.

The partial derivative $\delta j_i/\delta\Theta$ may be found by differential analysis of the construction lines that are intersected to form the instant center of rotation. FIG. 4 illustrates the process. The figure shows two lines, labeled 1 and 3, which intersect in point $p_2$; they are rotated to new positions 1' and 3' respectively, where they intersect in a new point, distance $\delta p_2$ from $p_2$. The lines are rotated by amounts $\delta\Theta_1$ and $\delta\Theta_3$, respectively.

In the case where $p_1$ and $p_3$ are the grounded joints of the four-bar linkage, and point $p_2$ is the instantaneous center of link 2, the length of line segment $\overline{p_1 p_2}$ is $l_1+r_1$, and the length of line segment $\overline{p_3 p_2}$ is $l_3+r_3$. Since $l_1$ and $l_3$ are parameters of the linkage, and constant, the value of $\delta p_2$ yields $r_1$ and $r_3$ trivially. The only remaining detail is to determine $\delta\Theta_3$ in terms of $\delta\Theta_1$, so only one independent quantity is used when taking the derivative. The ratio of the angular velocities provides this information:

$$\frac{\delta\theta_1}{\delta\theta_3} = \frac{\omega_1}{\omega_3}$$

In FIG. 4, the lines have been positioned to simplify the equations. Since line 1 passes through the origin, its equation is $y=x\tan\Theta_1$. Line 3 passes the x axis at $x=d$, so the equation is $y=(x-d)\tan\Theta_3$. The intersection point is then:

$$x = \frac{d\tan\theta_3}{\tan\theta_3 - \tan\theta_1}$$

$$y = \frac{d\tan\theta_1 \tan\theta_3}{\tan\theta_3 - \tan\theta_1}$$

The derivatives with respect to $\Theta_1$ are calculated using the known relationship between $\delta\Theta_1$ and $\delta\Theta_3$:

$$\frac{\partial x}{\partial \theta_1} = -\frac{d\tan\theta_3 (k\sec^2\theta_3 - \sec^2\theta_1)}{(\tan\theta_3 - \tan\theta_1)^2} + \frac{dk\sec^2\theta_3}{\tan\theta_3 - \tan\theta_1}$$

$$\frac{\partial y}{\partial \theta_1} = -\frac{d\tan\theta_1 \tan\theta_3 (k\sec^2\theta_3 - \sec^2\theta_1)}{(\tan\theta_3 - \tan\theta_1)^2} +$$

$$\frac{d\sec^2\theta_3 \tan\theta_1 + d\sec^2\theta_1 \tan\theta_3}{\tan\theta_3 - \tan\theta_1}$$

where $k = \frac{\partial \theta_1}{\partial \theta_3}$

Then, $$\frac{\partial p_2}{\partial \theta_1}$$

is found as the vector sum of the two above quantities.

Figure 5:
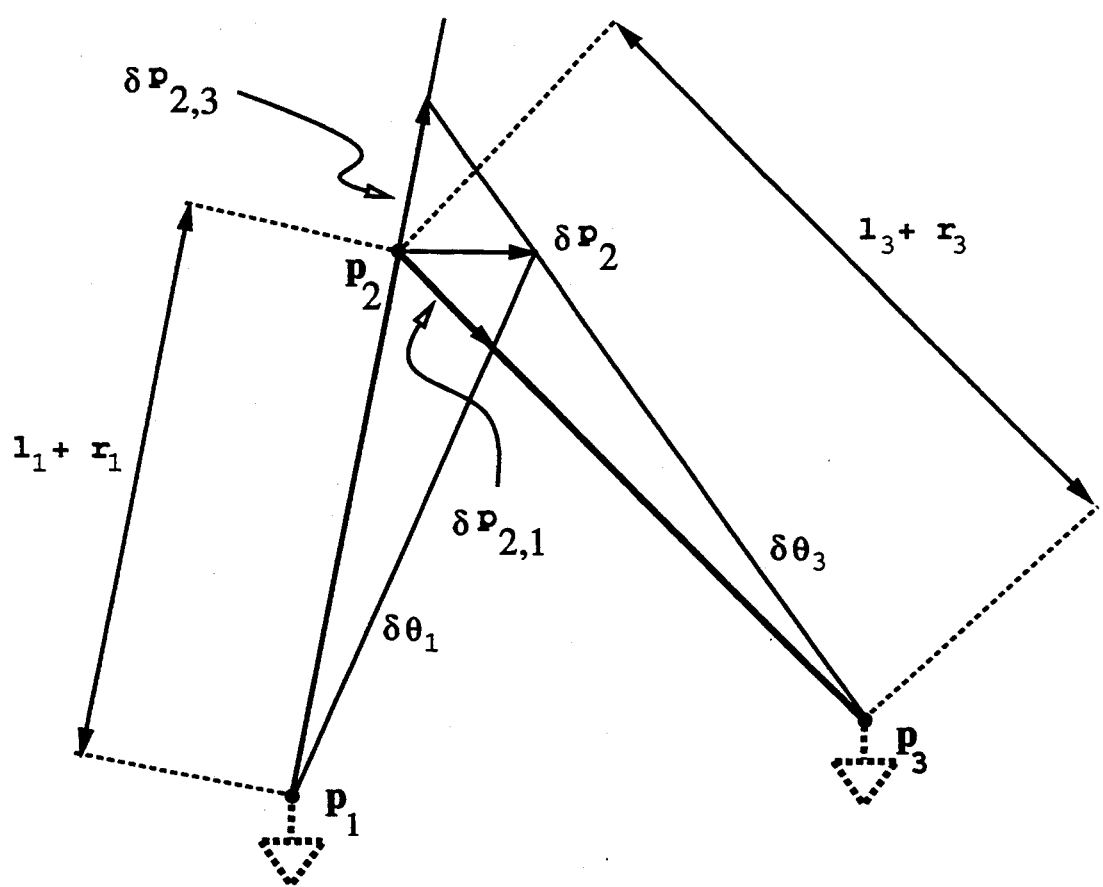
FIG. 5 geometrically depicts an alternative form for calculating the derivative of an instantaneous center.

The quantity $\delta j_i/\delta\Theta$ may alternatively be found through geometric sensitivity analysis, involving simple geometric constructions. FIG. 5 illustrates the technique.

Consider three points $p_1$, $p_2$, and $p_3$ where points $p_1$ and $p_3$ are fixed in space. If the line through $\overline{p_1 p_2}$ is rotated through a small displacement $\delta\Theta$ and $p_2$ is constrained on line $\overline{p_3 p_2}$, it will move in direction $\delta p_{2,1}$. If, on the other hand, line $\overline{p_3 p_2}$ is rotated by a small displacement $\delta\Theta_3$, $p_2$ will move in direction $\delta p_{2,3}$. For a composite change of both $\delta\Theta$, and $\delta\Theta_3$ the movement of point $p_2$ will be the, vector sum of the two independent movements (for infinitesimal displacements, the quadrangle on which the three vectors lie becomes a parallelogram).

In the case where $p_1$ and $p_3$ are the grounded joints of the four bar linkage, and point $p_2$ is the instantaneous center of link $l_1$, the length $\overline{p_1 p_2}$ is $l_1+r_1$ and is $l_1+r_3$. Since $l_1$ and $l_3$ are parameters of the linkage, and constant, the $\delta p_2$ value of yields $\delta r_1$ and $\delta r_3$ trivially. The only remaining detail is to determine $\delta\Theta_3$ in terms of $\delta\Theta_1$ so only one independent quantity is used when taking the derivative. The ratio of the angular velocities provides this information:

$$\frac{\delta\theta_1}{\delta\theta_3} = \frac{\omega_1}{\omega_3}$$

Many types of integration schemes may be used, but since the system of equations is purely differential, with no algebraic equations, stiffness should not be an overriding concern. Traditional integration schemes, such as adaptive step size Runge-Kutta and predictor-corrector methods, are believed to be preferred.

If integration uses large time-steps, the effect should be to have "approximate" dynamics. There is no danger of the mechanism "flying apart," since the kinematic constraints are not considered in the time integration. There is a trade-off between computation time, accuracy, and interactiveness.

3 Discussion

Generating the plan of geometric constructions to find velocities need only be done once for a given mechanism. After that, the plan may be reused during each step of the dynamic simulation. This approach of plan generation and reuse is fully explained in U.S. Pat. No. 5,043,929.

Since there are as many instantaneous screws as there are bodies in the mechanism, evaluation of the kinetic coenergy terms of the lagrangian takes time linearly proportional to the size of the mechanism. Kinematic analysis, necessary for the potential energy terms, is O(n log n), but typically linear in n, where n is the number of bodies in the mechanism.

Solving the lagrangian for the accelerations requires inverting a matrix of size d, the number of true degrees of freedom in the mechanism. This contrasts with the standard matrix-based approaches, where the matrix to be inverted is of size proportional to the number of bodies in the mechanism. In the worst case of a mechanism comprised exclusively of open chains, the number of true degrees of freedom will be proportional to the number of bodies; however, the absolute number of generalized coordinates being considered will still be less using the geometric algorithm, since the kinematic constraints are already eliminated.

Beneficially, the geometric constructions required for the velocity analysis can all be performed in a highly stylized fashion. If the gains in computational efficiency are comparable with the gains in kinematic simulation, the speedup in dynamic simulation could be substantial, affording interactive simulation speeds for many complex mechanisms.

While only mechanisms with fixed topology are currently simulated, known techniques should permit simulation of mechanisms with changeable topology.

Besides their use in formulating the dynamics equations, the geometric sensitivities can also be used for force analysis at selected points in the mechanism's trajectory, and for kinematic analysis of velocity ratios. These are quantities that could be optimized in a design at interactive rates.

If the dynamic behaviors can be simulated efficiently enough, it may be possible to make multi-dimensional "maps" of simulated behavior as a function of design parameter values. Such behavioral maps could be of substantial benefit in the design and debugging of complex mechanical devices.

I claim:

1. In a digital computer system a method of dynamic simulation of a mechanism having a plurality of components, comprising the steps of:
   a. determining kinematic information of the mechanism;
   b. finding the instantaneous screw axes of at least some of the mechanism components;
   c. calculating the angular and linear velocities of at least some of the mechanism components as ratios of distances of component center of mass to respective screw axes;
   d. determining kinetic coenergy terms of the mechanism using the angular and linear velocities;
   e. formulating a representation of the dynamics of the mechanism using the kinetic coenergy terms, and the kinematic information as the potential energy term;
   f. by integrating the accelerations over time; and
   g. simulating the dynamic behavior of the mechanism over time, given the starting values of position and velocities.

2. The method of claim 1, the representation of the dynamics being a lagrangian representation.

3. The method of claim 1, the representation being a lagrangian representation of the form:

$$\frac{d}{dt}\left[\frac{\partial L}{\partial \dot{\theta}}\right] - \frac{\partial L}{\partial \theta} = \Xi$$

where the first term is the kinetic coenergy term, the second term is the potential energy term, and $\Xi$ is the sum of any nonconservative forces.

4. The method of claim 1, the kinematic information being determined as a function of generalized position coordinates describing the mechanism components.

5. The method of claim 4, including determining the potential energy term using the kinematic information including calculating for one component the change in position of the mass center as a function of the change of the generalized position coordinates for the mechanism.

6. The method of claim 4, including determining the potential energy term using the kinematic information where the change in position for a component is:

$$\Delta P_1 = \frac{v_1}{v_2} \Delta P_2, \text{ where}$$

$\Delta P_1$ = Change in magnitude of position of component 1's center of mass relative to a change in some generalized position coordinate.
$v_1$ = linear velocity of component 1's center of mass
$v_2$ = linear velocity of component 2's center of mass
$\Delta P_2$ = known change in magnitude of position of component 2.

7. The method of claim 3, where the kinetic coenergy term is determined as follows, the derivative with respect to $\dot{\theta}$ is:

$$\frac{\partial L}{\partial \dot{\theta}} = \sum_i \left( m_i v_i \frac{\partial v_i}{\partial \dot{\theta}} + I_i \omega_i \frac{\partial \omega_i}{\partial \dot{\theta}} \right) = \dot{\theta} \sum_i (m_i j_i^2 + I_i k_i^2)$$

and the time derivative of this quantity is:

$$\frac{d}{dt}\left[\frac{\partial L}{\partial \dot{\theta}}\right] = \ddot{\theta} \sum_i (m_i j_i^2 + I_i k_i^2) + 2\dot{\theta} \sum_i \left( m_i j_i \frac{dj_i}{dt} + I_i k_i \frac{dk_i}{dt} \right)$$

where the j's and k's are ratios of distances to instantaneous screw axes.

8. The method of claim 7, where the time derivatives of the j's and k's, $$\frac{dj}{dt} \text{ and } \frac{dk}{dt},$$

are reduced to the derivatives of the j's and k's with respect to position $\Theta$:

$$\frac{dj_i}{dt} = \frac{dj_i}{d\theta} \frac{d\theta}{dt} = \dot{\theta}\frac{dj_i}{d\theta}$$

9. The method of claim 1, including compiling steps (a-g) into a plan, said plan being iteratively reused during simulation.

10. In a digital computer, a system for simulating the dynamics of a rigid-body mechanism, comprising:
- a kinematic simulator for determining a potenial energy term for the mechanism using a degrees of freedom analysis in terms of the generalized position coordinates of the mechanism;
- means for determining a kinetic coenergy term using information on the instantaneous screw axes for at least some of the bodies of the mechanism;
- a lagrangian constructor for formulating a lagrangian representation of the dynamics of the mechanism using the potential energy term and kinetic coenergy term;
- a plan generator which solves the lagrangian representation for accelerations to build a plan which simulates the dynamics when integrated over time; and
- a video display for showing said simulation of the dynamics of the mechanism over time.

11. The system according to claim 10, including an integrator for iteratively reusing the plan to produce new accelerations which are integrated over time, simulating the mechanism dynamics over time.

12. The system of claim 10, the kinetic coenergy term determining means operable for calculating angular and linear velocities as ratios of distances between points on the mechanism and the screw axes.

13. The system of claim 12, the kinetic coenergy term determining means operable for calculating the time derivatives of the screw axes.

* * * * *